(12) United States Patent
Chen (10) Patent No.: US 9,030,767 B2
(45) Date of Patent: May 12, 2015

(54) COLOR FILTER AND MANUFACTURING METHOD THEREOF

(75) Inventor: Hsiao Hsien Chen, Guangdong (CN)

(73) Assignee: Shenzhen China Star Optoelectronics Technology Co Ltd., Guangdong (CN)

( * ) Notice: Subject to any disclaimer, the term of this patent is extended or adjusted under 35 U.S.C. 154(b) by 251 days.

(21) Appl. No.: 13/639,201

(22) PCT Filed: May 15, 2012

(86) PCT No.: PCT/CN2012/075520
§ 371 (c)(1),
(2), (4) Date: Oct. 4, 2012

(87) PCT Pub. No.: WO2013/166735
PCT Pub. Date: Nov. 14, 2013

(65) Prior Publication Data
US 2013/0301153 A1 Nov. 14, 2013

(30) Foreign Application Priority Data
May 11, 2012 (CN) .......................... 2012 1 0146636

(51) Int. Cl.
*G02B 5/22* (2006.01)
*G03F 7/00* (2006.01)

(52) U.S. Cl.
CPC ................ *G02B 5/22* (2013.01); *G03F 7/0035* (2013.01); *Y10S 359/90* (2013.01)

(58) Field of Classification Search
None
See application file for complete search history.

(56) References Cited

U.S. PATENT DOCUMENTS 6,281,960 B1 * 8/2001 Kishimoto et al. ........... 349/156
8,310,628 B2 * 11/2012 Sakata et al. .................. 349/106

FOREIGN PATENT DOCUMENTS

JP         10206622 A * 8/1998 ............... G02B 5/20

* cited by examiner

*Primary Examiner* — Jade R Chwasz
(74) *Attorney, Agent, or Firm* — Kirton McConkie; Evan R. Witt (57) ABSTRACT

The present invention provides a color filter and a manufacturing method thereof. The method includes steps of: coating a first material layer on a substrate and patterning it to have first photoresists, first filter portions and first spacer portions; coating a second material layer on the substrate and patterning it to have second photoresists, second filter portions and second spacer portions; and coating a third material layer on the substrate and patterning it to have third photoresists, third filter portions and third spacer portions; and the first, the second, the third filter portions are correspondingly overlapped with each other, and the first, the second, the third spacer portions are correspondingly overlapped with each other.

10 Claims, 6 Drawing Sheets

COLOR FILTER AND MANUFACTURING METHOD THEREOF

BACKGROUND OF THE INVENTION

1. Field of the Invention

The present invention relates to a field of liquid crystal display technology, especially to a color filter and a manufacturing method thereof.

2. Description of the Related Art

Generally, a conventional manufacturing process of color filter of liquid crystal display device firstly mounts a black matrix layer on a substrate, then respectively disposes photo-resist layers of different colors (red, green and blue) on the substrate, and lastly mounts photo spacers on the substrate so as to control the cell gap of a liquid crystal cell.

In the above-mentioned manufacturing process, the black matrix layer, the red, green, blue photo-resist layers and the photo spacers are respectively formed through a photolithography process including coating, exposure and development steps. Therefore, the process of manufacturing a color filter needs to repeat the photolithography process at least five times, which not only results in a waste of material, but also extends the cycle time of the manufacturing process and thereby raising process cost.

SUMMARY OF THE INVENTION

An objective of the invention is to provide a manufacturing method of color filter to solve the technical problem of high process cost and long process time caused by the conventional technology that requires a photolithography process for making black matrix layer and another photolithography process for making photo spacers.

In order to solve the technical problem, the present invention provides a manufacturing method of color filter, and the manufacturing comprises steps of:

providing a substrate;

coating a first material layer on the substrate;

performing photolithography to the first material layer through a specific mask so as to pattern the first material layer to have multiple first photoresists and multiple first filter portions, wherein each of the first photoresists is connected to one of the first filter portions, and each of the first filter portions includes a first spacer portion formed on and protruding from a top surface of the first filter portion;

continuing to coat a second material layer on the substrate;

performing photolithography to the second material layer through the specific mask so as to pattern the second material layer to have multiple second photoresists alternately arranged with the first photoresists side by side at intervals and have multiple second filter portions overlapped with the first filter portions, wherein each of the second filter portions includes a second spacer portion formed on and protruding from a top surface of the second filter portion, and the second spacer portions correspond in position to the first spacer portions, respectively;

continuing to coat a third material layer; and performing photolithography to the third material layer through the specific mask to pattern the third material layer to have multiple third photoresists alternately arranged with the first photoresists and the second photoresists side by side at intervals and have multiple third filter portions overlapped with the second filter portions, wherein each of the third filter portions includes a third spacer portion formed on and protruding from a top surface of the third filter portion, and the third spacer portions correspond in position to the second spacer portions, respectively; wherein the specific mask includes multiple transparent areas for forming the first, the second and the third photoresists, multiple first half-transparent areas for forming the first, the second and the third filter portions and multiple shielding areas that are alternately arranged with the transparent areas; and each of the first half-transparent areas further has a second half-transparent area for forming the first, the second and the third spacer portions.

In one embodiment of the manufacturing method of color filter of the present invention, each of the second photoresists is connected to a corresponding one of the second filter portions.

In one embodiment of the manufacturing method of color filter of the present invention, each of the third photoresists is connected to a corresponding one of the third filter portions.

In one embodiment of the manufacturing method of color filter of the present invention, the method further includes steps of:

continuing to coat a fourth material layer on the substrate; and perform photolithography to fourth material layer through the specific mask so as to pattern the fourth material layer to have multiple fourth photoresists alternately arranged with the first, the second and the third photoresists side by side at intervals and have multiple fourth filter portions overlapped with the third filter portions, wherein each of the fourth filter portions further includes a fourth spacer portion formed on and protruding from a top surface of the fourth filter portion, and the fourth spacer portions correspond in position to the third spacer portions, respectively.

In one embodiment of the manufacturing method of color filter of the present invention, each of the fourth photoresists is connected to a corresponding one of the fourth filter portions.

Another objective of the present invention is to provide a manufacturing method of color filter to solve the technical problem of high process cost and long process time caused by the conventional technology requiring a photolithography process for making black matrix layer and another photolithography process for making photo spacers.

In order to solve the aforementioned technical problem, the present invention provides a manufacturing method of color filter, and the manufacturing comprises steps of:

providing a substrate;

coating a first material layer on the substrate;

performing photolithography to the first material layer through a specific mask so as to pattern the first material layer to have multiple first photoresists and multiple first filter portions, wherein each of the first photoresists is connected to one of the first filter portions, and each of the first filter portions includes a first spacer portion formed on and protruding from a top surface of the first filter portion;

continuing to coat a second material layer on the substrate;

performing photolithography to the second material layer through the specific mask so as to pattern the second material layer to have multiple second photoresists alternately arranged with the first photoresists side by side at intervals and have multiple second filter portions overlapped with the first filter portions, wherein each of the second filter portions includes a second spacer portion formed on and protruding from a top surface of the second filter portion, and the second spacer portions correspond in position to the first spacer portions, respectively;

continuing to coat a third material layer; and performing photolithography to the third material layer through the specific mask to pattern the third material layer to have multiple third photoresists alternately arranged with the first photoresists and the second photoresists side by side at intervals and have multiple third filter portions overlapped with the second filter portions, wherein each of the third filter portions includes a third spacer portion formed on and protruding from a top surface of the third filter portion, and the third spacer portions correspond in position to the second spacer portions, respectively.

In one embodiment of the manufacturing method of color filter of the present invention, each of the first photoresists is connected to a corresponding one of the first filter portions; each of the second photoresists is connected to a corresponding one of the second filter portions; and each of the third photoresists is connected to a corresponding one of the third filter portions.

In one embodiment of the manufacturing method of color filter of the present invention, the specific mask includes multiple transparent areas for forming the first, the second and the third photoresists, multiple first half-transparent areas for forming the first, the second and the third filter portions and multiple shielding areas that are alternately arranged with the transparent areas; and each of the first half-transparent areas further has a second half-transparent area for forming the first, the second and the third spacer portions.

In one embodiment of the manufacturing method of color filter of the present invention, the method further includes steps of:

continuing to coat a fourth material layer on the substrate; and perform photolithography to fourth material layer through the specific mask so as to pattern the fourth material layer to have multiple fourth photoresists alternately arranged with the first, the second and the third photoresists side by side at intervals and have multiple fourth filter portions overlapped with the third filter portions, wherein each of the fourth filter portions further includes a fourth spacer portion formed on and protruding from a top surface of the fourth filter portion, and the fourth spacer portions correspond in position to the third spacer portions, respectively.

In one embodiment of the manufacturing method of color filter of the present invention, each of the fourth photoresists is connected to a corresponding one of the fourth filter portions.

Still another objective of the present invention is to provide a color filter to solve the technical problem of high process cost and long process time caused by the conventional technology requiring a photolithography process for making black matrix layer and another photolithography process for making photo spacers.

In order to solve the technical problem, the present invention provides a color filter comprising multiple first photoresists, multiple second photoresists and multiple third photoresists alternately arranged with each other side by side at intervals on a substrate; wherein the first, the second and the third photoresists further have multiple first filter portions, second filter portions and third filter portions mounted therebetween, wherein each of the first filter portions is overlapped with a corresponding one of the second filter portions and a corresponding one of the third filter portions; each of the first filter portions includes a first spacer portion formed on and protruding from a top surface of the first filter portion; each of the second filter portions includes a second spacer portion formed on and protruding from a top surface of the second filter portion; each of the third filter portions includes a third spacer portion formed on and protruding from a top surface of the third filter portion; wherein the first spacer portions, the first filter portions and the first photoresists are formed together by performing photolithography to a first material layer on the substrate; the second spacer portions, the second filter portions and the second photoresists are formed together by performing photolithography to a second material layer on the substrate; and the third spacer portions, the third filter portions and the third photoresists are formed together by performing photolithography to a third material layer on the substrate.

In one embodiment of the color filter of the present invention, each of the first photoresists is connected to a corresponding one of the first filter portions; each of the second photoreisits is connected to a corresponding one of the second filter portions; and each of the third photoreisits is connected to a corresponding one of the third filter portions.

In one embodiment of the color filter of the present invention, the total thickness of the overlapped first, the second and the third spacer portions on the substrate is relatively larger than the thickness of the first photoresist, the thickness of the second photoresist or the thickness of the third photoresist on the substrate.

In one embodiment of the color filter of the present invention, the color filter further includes multiple fourth photoresists, multiple fourth filter portions and multiple fourth spacer portions, wherein the fourth photoresists are arranged alternately with the first, the second and the third photoresists side by side at intervals on the substrate; and each of the fourth filter portions is overlapped with a corresponding one of the first filter portions, a corresponding one of the second filter portions and a corresponding one of the third filter portions; each of the fourth spacer portions is formed on and protrudes from a top surface of a corresponding one of the fourth filter portions and corresponds to a corresponding one of the third spacer portions; the fourth spacer portions, the fourth filter portions and the fourth photoresists are formed together by performing photolithography to a fourth material layer on the substrate.

In one embodiment of the color filter of the present invention, each of the fourth photoresists is connected to a corresponding one of the fourth filter portions.

The present invention uses the material layers that are used for manufacturing red, green and blue photoresists to further form the overlapped first, second and third filter portions while manufacturing the red, green and blue photoresists. The first, the second and the third filter portions can respectively absorb light of different wavelengths so as to provide a light-shielding effect like black matrix, thus the overall manufacturing process does not need another specific photolithography process to manufacture a black matrix layer. Besides, in the processes of forming the first, the second and the third filter portions, the first, the second and the third spacer portions are correspondingly formed on and protruding from the top surface of the first, the second and the third filter portions so that the overall manufacturing process does not need another process to form spacers. Hence, material can be saved, production cost can be reduced, and the cycle time of the manufacturing process is shortened and thereby improving the production efficiency.

In order to make the contents of the present invention to be more easily understood, the preferred embodiments of the present invention are described in detail in cooperation with accompanying drawings as follows:

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

In the drawings, units with similar structure are labeled with the same reference number.

With reference to FIG. 1 and FIGS. 2A to 2J, FIG. 1 is a flow chart of a preferred embodiment of a manufacturing method of color filter in accordance with the present invention, and FIGS. 2A-2J are schematic views illustrating the manufacturing process of color filter of the present invention.

Figure 1:
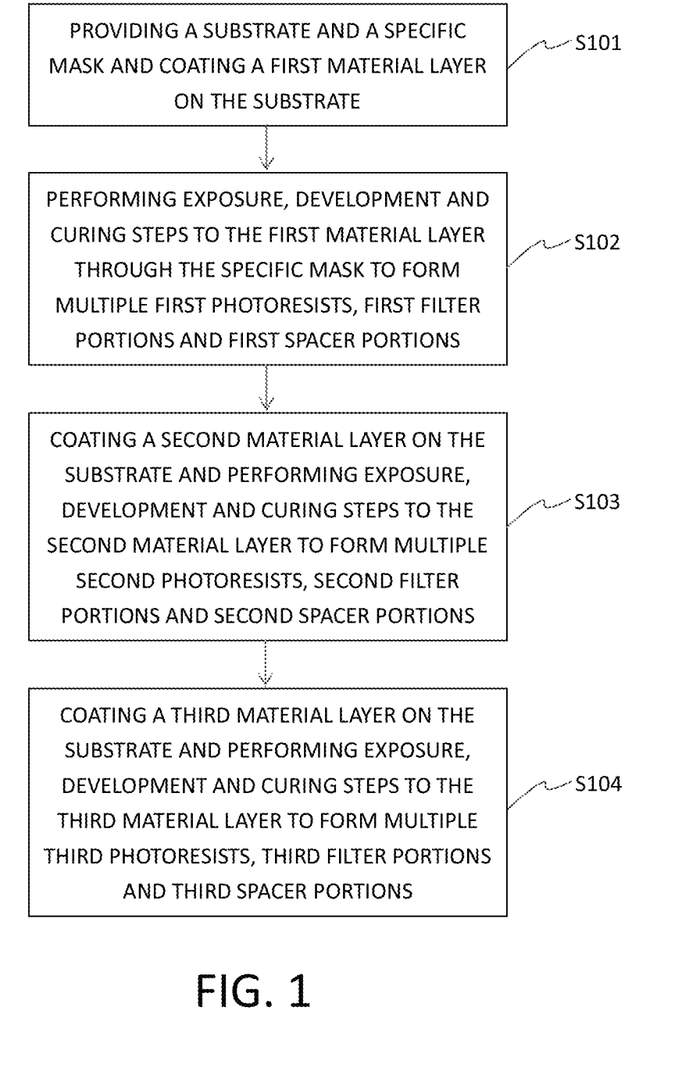
FIG. 1 is a flow chart of a preferred embodiment of a manufacturing method of color filter in accordance with the present invention.

In a step of S101, provide a substrate 10 and a specific mask 100, and coating a first material layer 20 on the substrate 10.

Figure 2A:
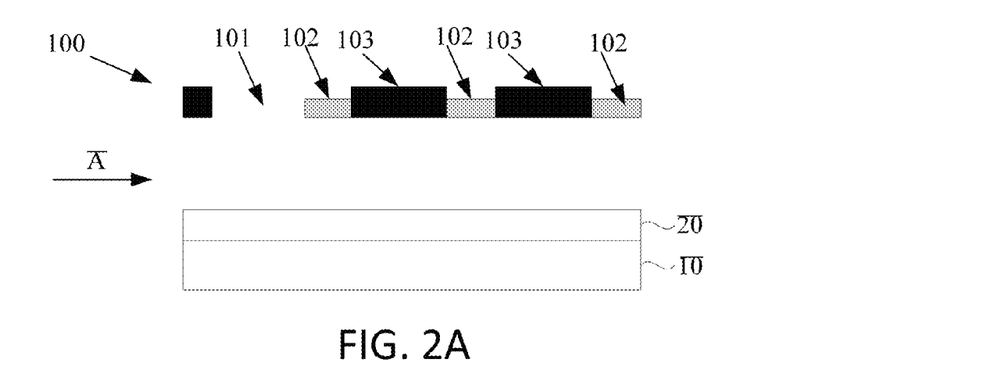
FIGS. 2A to 2J are schematic views illustrating the manufacturing process of color filter of the present invention.
Figure 2B:
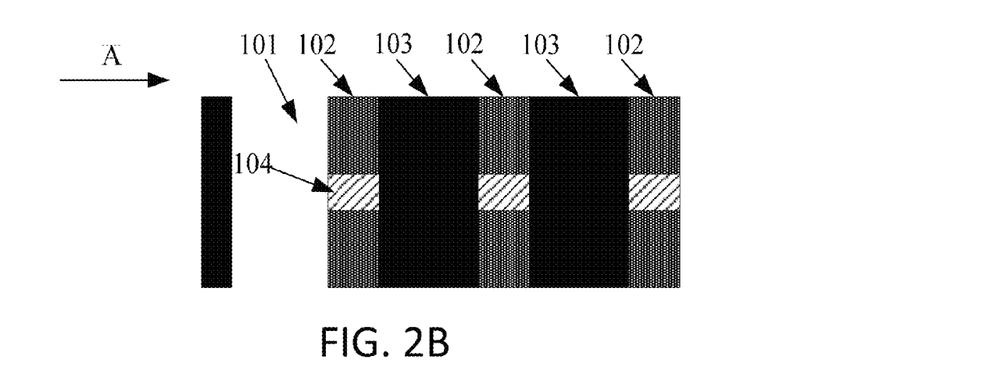

With reference to both FIG. 2A and FIG. 2B, FIG. 2A is a cross-sectional view of the substrate 10, the first material layer 100 and the specific mask 100, and FIG. 2B is a top view of the specific mask 100.

The mask 100, in an order from large to small of degrees of transparency, has multiple transparent areas 101, multiple second half-transparent areas 104, multiple first half-transparent areas 102 and multiple shielding areas 103.

Figure 2C:
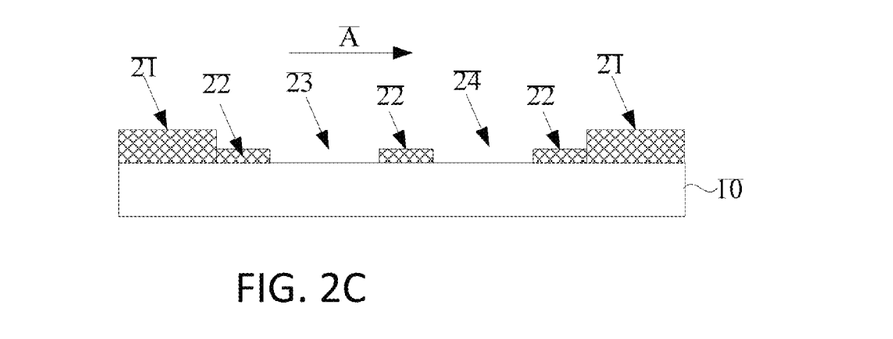
Figure 2D:
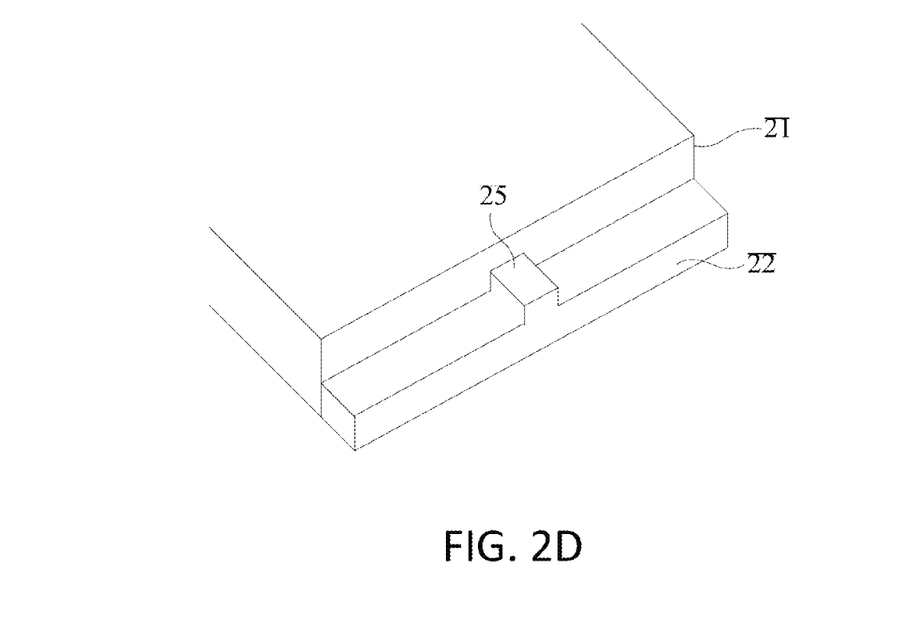

With further reference to FIG. 2C, in a step of S102, perform photolithography to the first material layer 20 through the specific mask 100 so as to pattern the first material layer 20 to have multiple first photoresists 21 and multiple first filter portions 22, multiple first coating areas 23, multiple second coating areas 24 and multiple first spacer portions 25 (as shown in FIG. 2D), wherein the photolithography comprises steps of exposure, development and curing, and FIG. 2C is a cross-sectional view of the substrate 10 and the patterned first material layer 20.

With reference to FIG. 2C, a first filter portion 22, a first coating area 23, another first filter portion 22, a second coating area 24 and still another first filter portion 22 are formed in order along a direction "A" between two adjacent first photoresists 21. With further reference to FIG. 2D, each of the first filter portions 22 has a first spacer portion 25 being formed on and protruding from a top surface of each of the first filter portions 22.

Figure 2E:
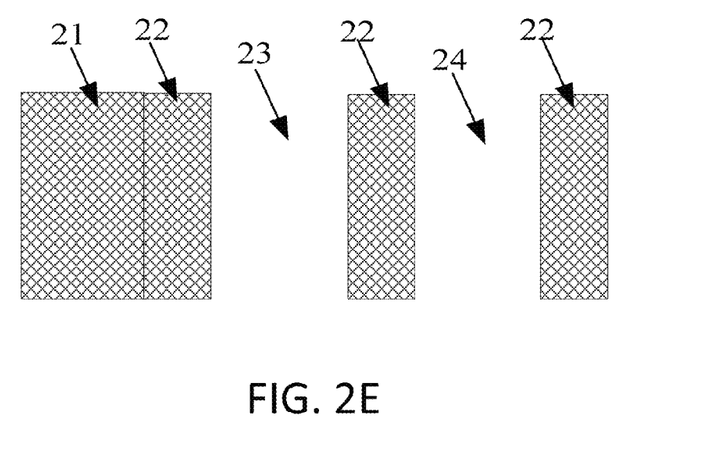

With further reference to FIG. 2E, FIG. 2E is a top view of FIG. 2C. Because the first material layer 20 is a layer of negative photoresist, the portion of the photoresist that is exposed to more lights becomes insoluble to the photoresist developer and is preserved during the development process. Hence, according to the specific mask 100 shown in FIG. 2B, the first photoresists 21 are formed through the transparent areas 101 of the specific mask 100 during the photolithography process; the first filter portions 22 are formed through the first half-transparent areas 102 of the specific mask 100 during the photolithography process; the first coating areas 23 and the second coating areas 24 are formed through the shielding areas 103 of the specific mask 100 during the photolithography process; and the first spacer portions 25 are formed through the second half-transparent areas 104 of the specific mask 100 during the photolithography process.

Figure 2F:
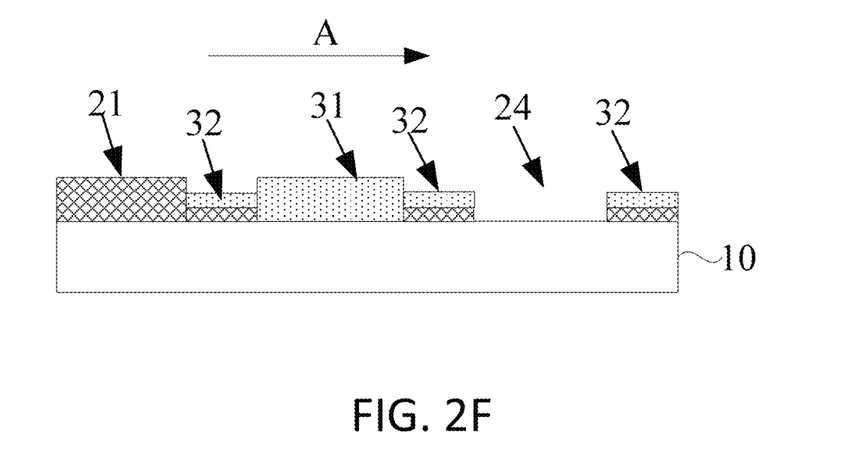

In a step of S103, continue to coat a second material layer on the substrate 10, and then perform photolithography to the second material layer so as to form multiple second photoresists 31 on the first coating areas 23, as shown in FIG. 2F, wherein FIG. 2F is a cross-sectional view of the substrate 10, the first photoresists 21 and the second photoresists 31.

In the meantime, a few portions of the second material layer are correspondingly reserved on the first filter portions 22 to become multiple second filter portions 32 while continuing to keep the second coating areas 24. In a specific implementation process, with reference to FIG. 2G, each of the second filter portions 32 further has a second spacer portion 35 formed on and protruding from a top surface of the second filter portion 32, wherein the second spacer portion 35 corresponds to one of the first spacer portions 25.

Figure 2G:
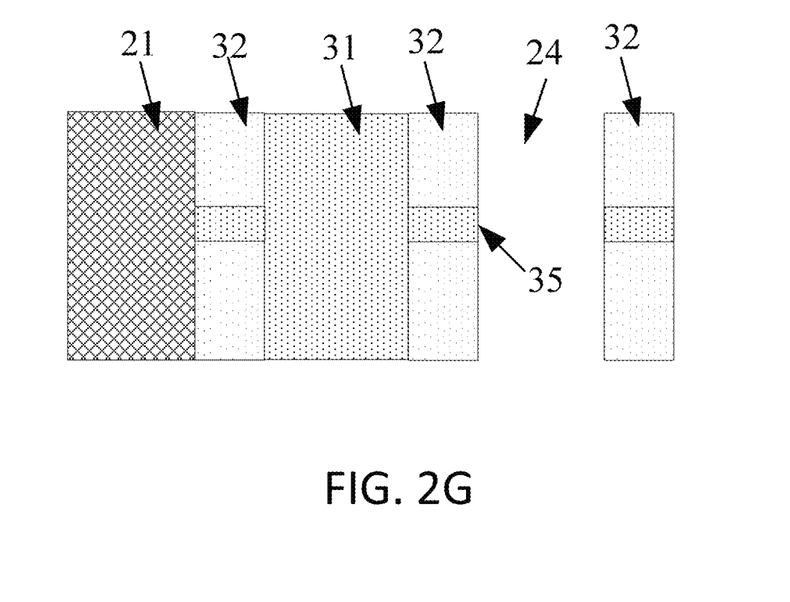

With further reference to FIG. 2G, according to the specific mask 100 shown in FIG. 2B, the second photoresists 31 are formed through the transparent areas 101 of the specific mask 100 during another photolithography process; the second filter portions 32 are formed through the first half-transparent areas 102 of the specific mask 100 during the photolithography process; the second coating areas 24 are kept through the shielding areas 103 of the specific mask 100 during the photolithography process; and the second spacer portions 35 are formed through the second half-transparent areas 104 of the specific mask 100 during the photolithography process. In a specific implemented operation, the specific mask 100 can be controlled to move along the direction "A" and cooperates with the photolithography to form the second photoresists 31 and the second filter portions 32.

Figure 2H:
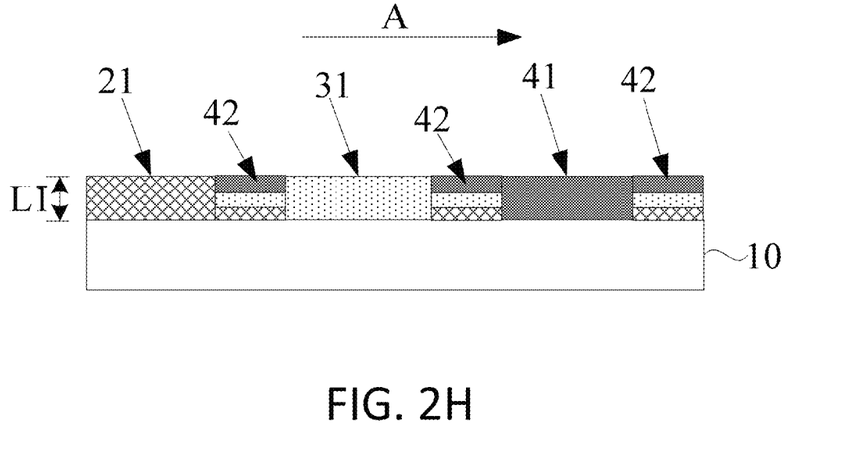

In a step of S104, continue to coat a third material layer on the substrate 10, and perform photolithography to the third material layer through the specific mask 100 so as to form multiple third photoresists 41 on the second coating areas 24, as shown in FIG. 2H, wherein FIG. 2H is a cross-sectional view of the substrate 10, the first photoresists 21, the second photoresists 31 and the third photoresist 41.

In the meantime, a few portions of the third material layer 31 are correspondingly reserved on the second filter portions 32 to become multiple third filter portions 42, wherein each of the third filter portions 42 further has a third spacer portion (not shown in the figure, but can be referred to FIG. 2D) on a top surface of the third filter portion 42.

Figure 2I:
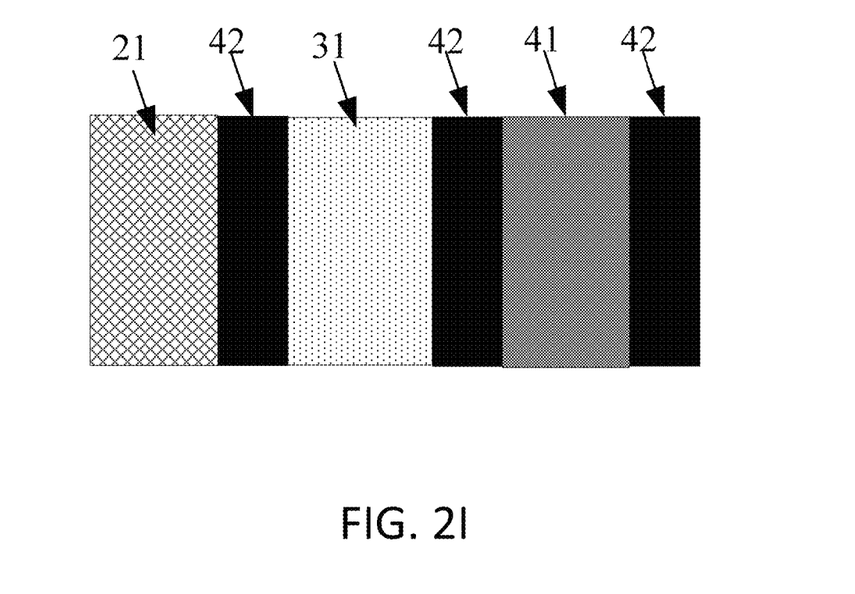

With reference to FIG. 2I, according to the specific mask 100 shown in FIG. 2B, the third photoresists 41 are formed through the transparent areas 101 of the specific mask 100 during another photolithography process; the third filter portions 42 are formed through the first half-transparent areas 102 of the specific mask 100 during the photolithography process; and the third spacer portions are formed through the second half-transparent areas 104 of the specific mask 100 during the photolithography process, wherein the specific mask 100 can be controlled to move along the direction "A" and cooperate with the photolithography process to form the foregoing third photoresists 41, the third filter portions 42 and the third spacer portions.

With further reference to FIGS. 2H and 2I, the first photoresists 21, the second photoresists 31 and the third photoresists 41 may be red, green and blue photoresists, respectively. As a preferred embodiment of the present invention, the first photoresists 21, the second photoresists 31 and the third photoresists 41 on the substrate 10 have the same thickness $L1$. The first, the second and the third filter portions 22, 32, 42 that are overlapped with each other on the substrate 10 have a total thickness being equal to $L1$. However, the total thickness may not be equal to L1 as long as the overlapped first, second and third filter portions 22, 32, 42 achieve a light-shielding effect.

In the present invention, the overlapped first, second and third filter portions 22, 32, 42 can respectively absorb light of different wavelengths so as to provide a light-shielding effect like black matrix. Besides, each of the first photoresists 21 is connected to a corresponding one of the first filter portions 22; each of the second photoresists 31 is connected to a corresponding one of the second filter portions 32; and each of the third photoresists 41 is connected to a corresponding one of the third filter portions 42, so that it ensures that the overlapped first, second and third filter portions 22, 32, 42 are seamlessly connected to the first, the second or the third photoresists 21, 31, 41 without forming any seam that may lead to light leakage.

Figure 2J:
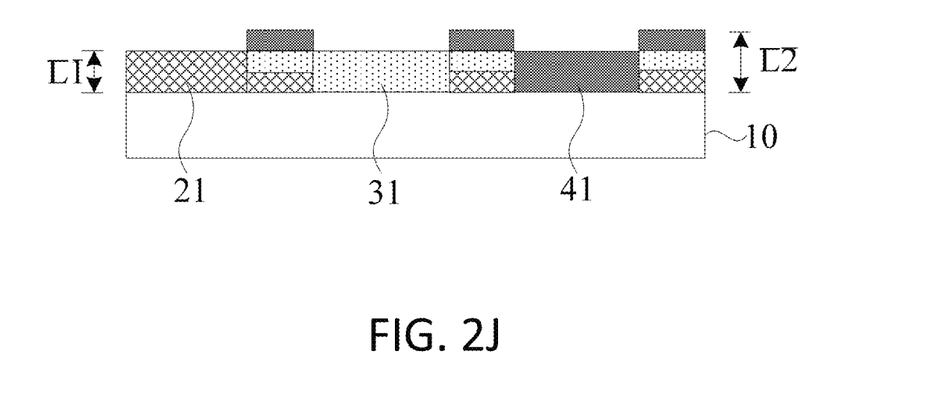

With further reference to FIG. 2J, FIG. 2J is a cross-sectional view of the substrate 10, the first, the second and third spacer portions after finishing the manufacturing process of the color filter. The overlapped first, second and third spacer portions on the substrate 10 have a total thickness that is equal to L2, wherein L2>L1. Hence, when constructing a liquid crystal display device, an effect can be achieved that a thin-film transistor substrate is spaced from the color filter of the present invention.

In a specific implementation process, please return to FIG. 2C, between two adjacent first photoresists 21, when a first filter portion 22, a first coating area 23, another first filter portion 22, a second coating area 24 and still another first filter portion 22 are formed in order along the direction "A", a third coating area and still another filter portion 22 may be further formed following the order along the direction "A", wherein the third coating area is used for forming a fourth photoresist, for example, a yellow photoresist. According to the above description, when forming the fourth photoresists, multiple fourth filter portions are correspondingly formed on the third filter portions 42 and multiple fourth spacer portions are correspondingly formed on the third spacer portions at the same time. Besides, the first, the second, the third and the fourth photoresists on the substrate 10 may have the same thickness L1. The first, the second, the third and the fourth filter portions that are overlapped with each other on the substrate 10 may have a total thickness being equal to L1. However, the total thickness may not be equal to L1 as long as the overlapped first, second, third and fourth filter portions achieve a light-shielding effect. As a preferred embodiment of the present invention, the overlapped first, second, third and fourth spacer portions on the substrate 10 have a total thickness L3 (not shown in the figures), wherein L3>L2, and L3>L1.

Furthermore, each of the fourth photoresists is connected to a correspondingly one of the fourth filter portions, so that it ensures that the overlapped first, second, third and fourth filter portions are seamlessly connected to the first, the second, the third and the fourth photoresists without forming any seam that may lead to light leakage.

The present invention further provides a color filter. The color filter is formed by the manufacturing method of color filter of the present invention. A detail structure of the color filter can be found in the above description in cooperation with FIGS. 2A to 2I, no more tautology here.

Figure 3:
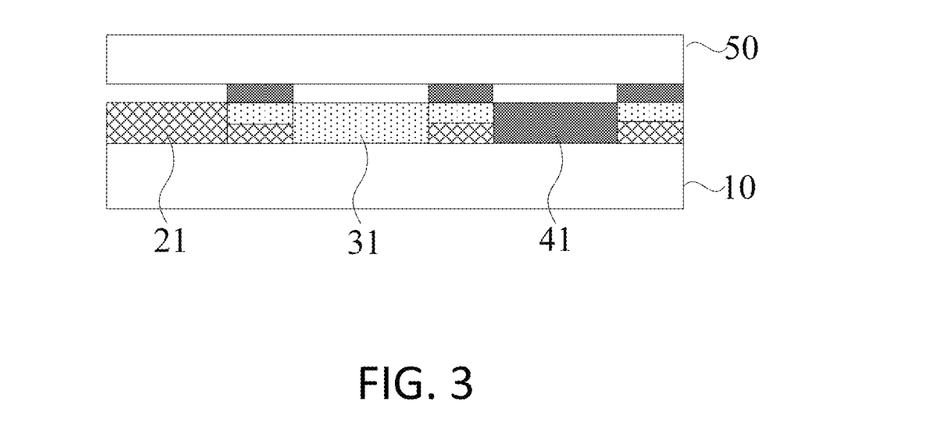
FIG. 3 is a schematic view of a liquid crystal display device using the color filter of the present invention.

Please refer to FIG. 3, wherein FIG. 3 is a schematic view of a liquid crystal display device using the color filter of the present invention. In a specific implementation process, a TFT substrate 50 is attached to the color filter of the present invention and is spaced from the color filter by the third spacer portions of the color filter. A specific implementation can also be found in the above description, no more tautology here.

The present invention uses the material layers that are used for manufacturing red, green and blue photoresists to further form the overlapped first, second and third filter portions while manufacturing the red, green and blue photoresists. The first, the second and the third filter portions can respectively absorb light of different wavelengths so as to provide a light-shielding effect like black matrix, thus the overall manufacturing process does not need another specific photolithography process to manufacture a black matrix layer. Besides, in the processes of forming the first, the second and the third filter portions, the first, the second and the third spacer portions are correspondingly formed on and protruding from the top surface of the first, the second and the third filter portions so that the overall manufacturing process does not need another process to form spacers. Hence, material can be saved, production cost can be reduced, and the cycle time of the manufacturing process is shortened and thereby improving the production efficiency.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A manufacturing method of a color filter comprising steps of:
   providing a substrate;
   coating a first material layer on the substrate;
   performing photolithography to the first material layer through a specific mask so as to pattern the first material layer to have multiple first photoresists and multiple first filter portions, wherein each of the first photoresists is connected to one of the first filter portions, and each of the first filter portions includes a first spacer portion formed on and protruding from a top surface of the first filter portion;
   continuing to coat a second material layer on the substrate;
   performing photolithography to the second material layer through the specific mask so as to pattern the second material layer to have multiple second photoresists alternately arranged with the first photoresists side by side at intervals and have multiple second filter portions overlapped with the first filter portions, wherein each of the second filter portions includes a second spacer portion formed on and protruding from a top surface of the second filter portion, and the second spacer portion corresponds in position to the first spacer portion;
   continuing to coat a third material layer; and
   performing photolithography to the third material layer through the specific mask to pattern the third material layer to have multiple third photoresists alternately arranged with the first photoresists and the second photoresists side by side at intervals and have multiple third filter portions overlapped with the second filter portions, wherein each of the third filter portions includes a third spacer portion formed on and protruding from a top surface of the third filter portion, and the third spacer portion corresponds in position to the second spacer portion; wherein
   the specific mask includes multiple transparent areas for forming the first, the second and the third photoresists, multiple first half-transparent areas for forming the first, the second and the third filter portions and multiple shielding areas that are alternately arranged with the transparent areas;

each of the first half-transparent areas further has a second half-transparent area for forming the first, the second and the third spacer portions;

wherein the first, the second and the third filter portions are overlapped with each other and mounted between the first, the second and the third photoresists.

2. The manufacturing method of a color filter as claimed in claim 1, wherein each of the second photoresists is connected to a corresponding one of the second filter portions.

3. The manufacturing method of a color filter as claimed in claim 1, wherein each of the third photoresists is connected to a corresponding one of the third filter portions.

4. The manufacturing method of a color filter as claimed in claim 1, wherein the method further includes steps of:

continuing to coat a fourth material layer on the substrate; and perform photolithography to fourth material layer through the specific mask so as to pattern the fourth material layer to have multiple fourth photoresists alternately arranged with the first, the second and the third photoresists side by side at intervals and have multiple fourth filter portions overlapped with the third filter portions, wherein each of the fourth filter portions further includes a fourth spacer portion formed on and protruding from a top surface of the fourth filter portion, and the fourth spacer portions correspond in position to the third spacer portions, respectively.

5. The manufacturing method of a color filter as claimed in claim 4, wherein each of the fourth photoresists is connected to a corresponding one of the fourth filter portions.

6. A manufacturing method of a color filter comprising steps of:

providing a substrate;

coating a first material layer on the substrate;

performing photolithography to the first material layer through a specific mask so as to pattern the first material layer to have multiple first photoresists and multiple first filter portions, wherein each of the first photoresists is connected to one of the first filter portions, and each of the first filter portions includes a first spacer portion formed on and protruding from a top surface of the first filter portion;

continuing to coat a second material layer on the substrate;

performing photolithography to the second material layer through the specific mask so as to pattern the second material layer to have multiple second photoresists alternately arranged with the first photoresists side by side at intervals and have multiple second filter portions overlapped with the first filter portions, wherein each of the second filter portions includes a second spacer portion formed on and protruding from a top surface of the second filter portion, and the second spacer portions correspond in position to the first spacer portions, respectively;

continuing to coat a third material layer; and performing photolithography to the third material layer through the specific mask to pattern the third material layer to have multiple third photoresists alternately arranged with the first photoresists and the second photoresists side by side at intervals and have multiple third filter portions overlapped with the second filter portions, wherein each of the third filter portions includes a third spacer portion formed on and protruding from a top surface of the third filter portion, and the third spacer portions correspond in position to the second spacer portions, respectively;

wherein the first, the second and the third filter portions are overlapped with each other and mounted between the first, the second and the third photoresists.

7. The manufacturing method of a color filter as claimed in claim 6, wherein each of the first photoresists is connected to a corresponding one of the first filter portions; each of the second photoresists is connected to a corresponding one of the second filter portions; and each of the third photoresists is connected to a corresponding one of the third filter portions.

8. The manufacturing method of a color filter as claimed in claim 6, wherein the specific mask includes multiple transparent areas for forming the first, the second and the third photoresists, multiple first half-transparent areas for forming the first, the second and the third filter portions and multiple shielding areas that are alternately arranged with the transparent areas; and each of the first half-transparent areas further has a second half-transparent area for forming the first, the second and the third spacer portions.

9. The manufacturing method of a color filter as claimed in claim 6, wherein the method further includes steps of:

continuing to coat a fourth material layer on the substrate; and perform photolithography to fourth material layer through the specific mask so as to pattern the fourth material layer to have multiple fourth photoresists being alternately arranged with the first, the second and the third photoresists side by side at intervals and have multiple fourth filter portions overlapped with the third filter portions, wherein each of the fourth filter portions further includes a fourth spacer portion formed on and protruding from a top surface of the fourth filter portion, and the fourth spacer portions correspond in position to the third spacer portions, respectively.

10. The manufacturing method of a color filter as claimed in claim 9, wherein each of the fourth photoresists is connected to a corresponding one of the fourth filter portions.

* * * * *